United States Patent
Choi et al.

(10) Patent No.: US 10,626,252 B2
(45) Date of Patent: *Apr. 21, 2020

(54) COMPOSITE WITH IMPROVED MECHANICAL PROPERTIES AND MOLDED ARTICLE INCLUDING THE SAME

(71) Applicant: LG CHEM, LTD., Seoul (KR)

(72) Inventors: YeonSik Choi, Daejeon (KR); SuMin Lee, Daejeon (KR); GiDae Choi, Daejeon (KR); ChangHun Yun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/141,712

(22) Filed: Sep. 25, 2018

(65) Prior Publication Data

US 2019/0023875 A1    Jan. 24, 2019

Related U.S. Application Data

(63) Continuation of application No. 15/123,427, filed as application No. PCT/KR2015/009137 on Aug. 31, 2015, now Pat. No. 10,113,056.

(30) Foreign Application Priority Data

Aug. 29, 2014  (KR) .................. 10-2014-0113752
Aug. 31, 2015  (KR) .................. 10-2015-0122706

(51) Int. Cl.
| | | |
|---|---|---|
| H01B 1/04 | (2006.01) | |
| H01B 1/24 | (2006.01) | |
| B82Y 30/00 | (2011.01) | |
| C08K 7/14 | (2006.01) | |
| C08K 3/04 | (2006.01) | |
| C08K 7/24 | (2006.01) | |
| C08J 5/04 | (2006.01) | |
| C08K 7/00 | (2006.01) | |
| C08L 101/00 | (2006.01) | |
| C01B 32/05 | (2017.01) | |

(52) U.S. Cl.
CPC ............... *C08K 7/14* (2013.01); *C01B 32/05* (2017.08); *C08J 5/04* (2013.01); *C08K 3/04* (2013.01); *C08K 3/041* (2017.05); *C08K 7/00* (2013.01); *C08K 7/24* (2013.01); *C08L 101/00* (2013.01); *C08K 3/042* (2017.05); *C08K 3/045* (2017.05); *C08K 3/046* (2017.05); *C08K 2201/001* (2013.01); *C08K 2201/003* (2013.01); *C08K 2201/004* (2013.01); *C08K 2201/011* (2013.01)

(58) Field of Classification Search
CPC .... H01B 1/04; H01B 1/24; B29B 9/06; B29B 7/00; B82Y 30/00; B82Y 40/00

USPC ............ 252/500, 502, 510, 511; 423/445 R, 423/445 B, 460; 977/742, 783

See application file for complete search history.

(56) References Cited

U.S. PATENT DOCUMENTS

| | | | |
|---|---|---|---|
| 7,678,295 B2 | 3/2010 | Elkovitch et al. | |
| 2006/0211807 A1 | 9/2006 | Koning et al. | |
| 2009/0057621 A1 | 3/2009 | Keulen et al. | |
| 2013/0244023 A1* | 9/2013 | Kowlgi .................. B01J 21/185 428/328 |
| 2014/0221533 A1 | 8/2014 | Hata et al. | |

FOREIGN PATENT DOCUMENTS

| | | |
|---|---|---|
| CA | 2861532 A1 | 8/2013 |
| JP | 2002-231051 A | 8/2002 |
| JP | 2003238816 A | 8/2003 |
| JP | 2004-210583 A | 7/2004 |
| JP | 2005200620 A | 7/2005 |
| JP | 2008-174442 A | 7/2008 |
| JP | 2008285789 A | 11/2008 |
| JP | 2010-024131 A | 2/2010 |
| JP | 2010-506970 A | 3/2010 |
| JP | 2012-224687 A | 11/2012 |
| JP | 2014-101401 A | 6/2014 |
| KR | 1020120113218 A | 10/2012 |
| KR | 1020140009139 A | 1/2014 |
| WO | 2013/051707 A1 | 4/2013 |

OTHER PUBLICATIONS

Database WPI: "Polyamide resin composition for e.g. motor vehicle component, electrical component, and electronic component comprises polyamide resin and multiwalled carbon nanotube which is functionalized by surface-treating with hydrogen peroxide", XP002777556, Thomson Scientific, Jun. 5, 2014 (Corresponds to JP2014-101401A).

Andrews, "Fabrication of Carbon Multiwall Nanotube/Polymer Composites by Shear Mixing"; Macro. Mater. Eng., 287 pp. 395-403; 2002.

* cited by examiner

*Primary Examiner* — Tri V Nguyen
(74) *Attorney, Agent, or Firm* — Dentons US LLP

(57) ABSTRACT

The present invention provides a composite obtained by processing a resin composition including a thermoplastic resin, multi-walled carbon nanotubes. The multi-walled carbon nanotubes have an average diameter of 10 nm-3 nm and an Id/Ig of 0.6 or more. The walls of the multi-walled carbon nanotubes consist of 10 or more layers of graphene. The rate of residual length of the carbon nanotubes present in the composite is 40% or more. The composite has improved mechanical properties without deterioration of conductivity. Due to these advantages, the composite can be used to manufacture various molded articles.

19 Claims, No Drawings

COMPOSITE WITH IMPROVED MECHANICAL PROPERTIES AND MOLDED ARTICLE INCLUDING THE SAME

This application is a Continuation of U.S. patent application Ser. No. 15/123,427 filed Sep. 2, 2016, now allowed, which is the U.S. National Phase application of International Application No. PCT/KR2015/009137 filed on Aug. 31, 2015, which claims the benefit of Korean Patent Application No. 10-2014-0113752, filed Aug. 29, 2014, and Korean Patent Application No. 10-2015-0122706, filed Aug. 31, 2015 and all of which are hereby incorporated by reference in their entirety for all purposes as if fully set forth herein.

TECHNICAL FIELD

This application claims the benefit of priority to Korean Patent Application No. 10-2014-0113752, filed on Aug. 29, 2014, the entire disclosure of which is incorporated herein by reference.

The present invention relates to a composite with improved mechanical properties and a molded article including the same.

BACKGROUND ART

Thermoplastic resins, particularly high performance plastics with excellent mechanical properties and good heat resistance, are used in various applications. For example, polyamide resins and polyester resins are suitable for use in the manufacture of a variety of industrial parts, including electrical/electronic parts, machine parts and automotive parts, mainly by injection molding due to their good balance of mechanical properties and toughness. Polyester resins, particularly polybutylene terephthalate and polyethylene terephthalate, with excellent moldability, heat resistance, mechanical properties, and chemical resistance are widely used as materials for industrial molded articles such as connectors, relays, and switches of automobiles and electrical/electronic devices. Amorphous resins such as polycarbonate resins are highly transparent and dimensionally stable. Due to these advantages, amorphous resins are used in many fields, including optical materials and parts of electric appliances, OA equipment, and automobiles.

Electrical/electronic parts should be prevented from malfunction caused by static electricity and contamination by dirt. For this purpose, electrical/electronic parts are required to have antistatic properties. Automobile fuel pump parts are also required to have high electrical conductivity in addition to existing physical properties.

Additives such as surfactants, metal powders and metal fibers are generally used to impart electrical conductivity to resins. However, these additives tend to deteriorate the physical properties (such as conductivity and mechanical strength) of final molded articles.

Conductive carbon black is a common material for imparting conductivity to resins. However, the addition of a large amount of carbon black is necessary to achieve high electrical conductivity and the structure of carbon black also tends to decompose during melt mixing. The resulting resins suffer from poor processability and considerable deterioration in thermal stability and other physical properties.

Under these circumstances, research has concentrated on resin composites including carbon nanotubes instead of conductive carbon black in order to achieve improved conductivity while reducing the amount of conductive fillers added.

DISCLOSURE OF THE INVENTION

Technical Problem

It is an object of the present invention to provide a composite with high conductivity and improved mechanical properties.

It is a further object of the present invention to provide a molded article with high conductivity and improved mechanical properties.

Solution to Problem

One aspect of the present invention provides a composite obtained by processing a resin composition including a thermoplastic resin, multi-walled carbon nanotubes, and a reinforcing material wherein the average diameter of the multi-walled carbon nanotubes is 10 nm or more, the walls of the multi-walled carbon nanotubes consist of 10 or more layers of graphene, the $I_d/I_g$ of the multi-walled carbon nanotubes is 1 or less, and the rate of residual length of the carbon nanotubes present in the composite is 40% or more, the rate of residual length being defined by Equation 1:

$$\text{Rate of residual length (\%)} = (\text{Content of } \geq 500 \text{ nm long carbon nanotubes in the composite})/(\text{Content of all carbon nanotubes in the composite}) \times 100 \quad \text{<Equation 1>}$$

A further aspect of the present invention provides a molded article including the composite.

Advantageous Effects of the Invention

The composite according to one aspect of the present invention is obtained by extrusion of a thermoplastic resin composition including multi-walled carbon nanotubes and a reinforcing material. The multi-walled carbon nanotubes as raw materials have a predetermined average diameter and their walls consist of a predetermined number of graphene layers, contributing to improvements in the conductivity and mechanical properties of the composite. In addition, the carbon nanotubes have a low $I_d/I_g$, indicating that they undergo less decomposition during extrusion. As a result, the carbon nanotubes present in the composite are less reduced in average length, resulting in an improvement in the conductivity of the composite while minimizing changes in the physical properties of the thermoplastic resin. Therefore, the molded article obtained by molding the composite is suitable for use in various parts where high conductivity and mechanical properties are required.

BEST MODE FOR CARRYING OUT THE INVENTION

The present invention will now be described in detail. It should be understood that the terms and words used in the specification and claims are not to be construed as having common and dictionary meanings, but are construed as having meanings and concepts corresponding to the spirit of the invention in view of the principle that the inventor can define properly the concept of the terms and words in order to describe his/her invention with the best method.

One embodiment of the present invention provides a composite obtained by processing a resin composition including a thermoplastic resin, multi-walled carbon nanotubes, and a reinforcing material wherein the average diameter of the multi-walled carbon nanotubes is 10 nm or more, the walls of the multi-walled carbon nanotubes consist of 10 or more layers of graphene, the $I_d/I_g$ of the multi-walled carbon nanotubes is 1 or less, and the rate of residual length of the carbon nanotubes present in the composite is 40% or more, the rate of residual length being defined by Equation 1:

Rate of residual length (%)=(Content of ≥500 nm long carbon nanotubes in the composite)/(Content of all carbon nanotubes in the composite)× 100 [Equation 1]

A thermoplastic resin composition including carbon nanotubes and a reinforcing material can be processed into a composite with improved mechanical properties and conductivity. At this time, the inherent mechanical properties of the thermoplastic resin and the physical properties of the carbon nanotubes and the reinforcing material should be prevented from deteriorating as much as possible during processing. However, when the raw materials are processed, for example, by extrusion requiring high temperature and high pressure conditions, they get crushed or cut in this course, resulting in deterioration of mechanical properties.

In the present invention, deterioration of the physical properties of the raw materials during processing is minimized without substantially losing their inherent characteristics, achieving desired conductivity and mechanical properties of the composite. To this end, the average diameter and wall number of the multi-walled carbon nanotubes as raw materials are limited to the predetermined values defined above. Thus, the carbon nanotubes present in the composite are prevented from deformation, such as cutting, resulting in a high rate of residual length.

The $I_d/I_g$ represents the ratio of the intensity of D peak (D band) to the intensity of G peak (G band) in the Raman spectrum of the carbon nanotubes before the processing. Generally, the Raman spectrum of carbon nanotubes has two major distinguishable peaks corresponding to graphitic $sp^2$ bonds, that is, a higher peak at 1,100 to 1,400 $cm^{-1}$ and a lower peak at 1,500 to 1,700 $cm^{-1}$. The first peak (D-band) centered at around 1,300 $cm^{-1}$, for example, around 1,350 $cm^{-1}$, is indicative of the presence of carbon particles and reflects the characteristics of incomplete and disordered walls. The second peak (G-band) centered at around 1,600 $cm^{-1}$, for example, 1580 $cm^{-1}$, is indicative of the formation of continuous carbon-carbon (C—C) bonds and reflects the characteristics of crystalline graphite layers of carbon nanotubes. The wavelength values may slightly vary depending on the wavelength of a laser used for spectral measurement.

The degree of disorder or defectiveness of the carbon nanotubes can be evaluated by the intensity ratio of D-band peak to G-band peak ($I_d/I_g$). As the ratio $I_d/I_g$ increases, the carbon nanotubes can be evaluated to be highly disordered or defective. As the ratio $I_d/I_g$ decreases, the carbon nanotubes can be evaluated to have few defects and a high degree of crystallinity. The term "defects" used herein is intended to include imperfections, for example, lattice defects, in the arrangement of the carbon nanotubes formed when unnecessary atoms as impurities enter the constituent carbon-carbon bonds of the carbon nanotubes, the number of necessary carbon atoms is insufficient, or misalignment occurs. The carbon nanotubes are easily cut at the defective portions when external stimuli are applied thereto.

Each of the intensities of D-band peak and G-band peak may be, for example, defined as either the height of the peak above the X-axis center of the band or the area under the peak in the Raman spectrum. The height of the peak above the X-axis center of the corresponding band may be adopted for ease of measurement.

According to one embodiment, the $I_d/I_g$ of the carbon nanotubes used as raw materials may be limited to the range of 0.01 to 1.0, for example, 0.01 to 0.7 or 0.01 to 0.5. Within this range, the average length of the carbon nanotubes present in the composite as the final product can be less reduced. The rate of residual average length of the carbon nanotubes can be represented by Equation 1:

Rate of residual length (%)=(Content of ≥500 nm long carbon nanotubes in the composite)/(Content of all carbon nanotubes in the composite)× 100 [Equation 1]

When the rate of residual length is high, a small amount of the carbon nanotubes can be used to increase the conductivity of the thermoplastic resin, which is advantageous in maintaining the physical properties of the resin.

In the present invention, the diameter, the wall number, and the $I_d/I_g$ of the carbon nanotubes as raw materials added to the thermoplastic resin before processing are limited to the predetermined values defined above. By selective use of the hard carbon nanotubes with few defects and high hardness, a reduced amount of the carbon nanotubes is cut during processing such as extrusion. A reduction in the amount of the carbon nanotubes cut by external stimuli applied in the course of processing leads to an increase in the rate of residual length of the carbon nanotubes after processing.

The carbon nanotubes with an increased rate of residual length are structurally advantageous in improving the conductivity of the thermoplastic resin. The carbon nanotubes have network structures within a matrix of the thermoplastic resin. Accordingly, the longer carbon nanotubes remaining in the final product are more advantageous in the formation of the networks, and as a result, the frequency of contact between the networks decreases. This leads to a reduction in contact resistance, contributing to a further improvement in conductivity.

According to one embodiment, the rate of residual length of the carbon nanotubes may be 40% or more, for example, in the range of 40% to 99%, 40% to 90% or 45% to 90%. Within this range, the conductivity of the composite as the final product can be improved while maintaining the processability of the composite without deterioration of mechanical properties.

The carbon nanotubes used in the present invention are allotropes of carbon and refer to tubular materials that consist of carbon atoms arranged in a hexagonal honeycomb pattern and whose diameter is extremely small in the nanometer range.

The carbon nanotubes are rolled-up graphene sheets with diameters on a nanometer scale and may have various structures whose characteristics are different depending on the rolled angle and shape of the graphene sheets. The carbon nanotubes can be classified into single-walled carbon nanotubes (SWCNTs) and multi-walled carbon nanotubes (MWCNTs) according to the number of walls consisting of graphene sheets.

Unlike single-walled carbon nanotubes, multi-walled carbon nanotubes undergo less damage, such as cutting, during production of the composite, leaving a larger residual length after processing. This can contribute to further improvements in the mechanical strength and electrical conductivity of the composite as the processed product.

According to one embodiment, the multi-walled carbon nanotubes used in the production of the composite of the present invention have walls consisting of 10 or more graphene sheets, for example, 10 to 50 graphene sheets or 10 to 30 graphene sheets. The use of the multi-walled carbon nanotubes whose walls consist of about 10 or more graphene sheets can further improve the mechanical strength of the composite.

According to one embodiment, the multi-walled carbon nanotubes used as raw materials in the production of the composite of the present invention may have an average diameter of about 10 nm or more, for example, in the range of about 10 nm to about 30 nm. Within this range, the residual length of the multi-walled carbon nanotubes after processing such as extrusion is less reduced, and as a result, the composite as the final product can be prevented from deterioration of mechanical strength and electrical conductivity.

According to one embodiment, the multi-walled carbon nanotubes as raw materials may have an average length of about 500 nm or more, for example, in the range of 800 nm to 1,000 μm or 800 nm to 300 μm. Within this range, the multi-walled carbon nanotubes are structurally advantageous in improving the conductivity of the thermoplastic resin composite.

According to one embodiment, the multi-walled carbon nanotubes present in the thermoplastic resin composite may have an average length of about 0.5 μm or more, 0.6 μm or more or 0.7 μm or more and 50 μm or less, 30 μm or less or 10 μm or less.

The multi-walled carbon nanotubes may be used in an amount of about 0.1 to about 10 parts by weight or about 0.1 to 5 parts by weight, based on 100 parts by weight of the thermoplastic resin. Within this range, the conductivity of the composite can be improved while minimizing the deterioration of the mechanical properties inherent to the thermoplastic resin.

The multi-walled carbon nanotubes are not limited to a particular type and may be of a bundle type or non-bundle type.

Unless otherwise mentioned, the term "bundle type" used herein refers to a type of carbon nanotubes in which the carbon nanotubes are arranged in parallel or get entangled to form bundles or ropes, and the term "non-bundle or entangled type" describes a type of carbon nanotubes that does not have a specific shape such as a bundle- or rope-like shape.

The bundle type multi-walled carbon nanotubes basically have a shape in which carbon nanotube strands are joined together to form bundles. These strands may have a straight or curved shape or a combination thereof. The bundle type carbon nanotubes may also have a linear or curved shape or a combination thereof.

According to one embodiment, the bundle type carbon nanotubes used in the production of the thermoplastic resin composite may have a relatively high bulk density in the range of 80 to 250 kg/m$^3$, for example, 100 to 220 kg/m$^3$. Within this range, the conductivity of the composite can be advantageously improved.

According to one embodiment, the reinforcing material used in the production of the composite may have a fibrous shape. Due to this shape, the reinforcing material can form a network structure within a matrix of the thermoplastic resin and can get structurally entangled with the multi-walled carbon nanotubes, leading to an improvement in the mechanical strength of the composite as the final product.

Any reinforcing material that has a fibrous shape may be used without limitation in the composite of the present invention. For example, the reinforcing material may be selected from carbon fibers, glass fibers, milled glass fibers, aramid fibers, alumina fibers, silicon carbide fibers, ceramic fibers, asbestos fibers, gypsum fibers, metal fibers, and mixtures thereof.

The reinforcing material may be a carbonaceous or graphitic carbon fiber. Specific examples of carbonaceous carbon fibers include carbon powders, fine carbon particles, carbon black, and carbon fibers. More specifically, the use of a needle-like carbon fiber with a diameter of about 5 to about 15 μm and a length of about 100 μm to about 900 μm is preferred. The use of a carbon fiber having an aspect ratio (length-to-height ratio, l/H) of 250 to 1,600 is also preferred.

The reinforcing material having a fibrous shape may be a glass fiber. The glass fiber may be any of those that are commercially available in the art. For example, the glass fiber may have a diameter of about 8 to about 20 μm and a length of about 1.5 to 8 mm. When the diameter of the glass fiber is in the range defined above, the impact resistance of the composition can be effectively improved. When the length of the glass fiber is in the range defined above, the composition can be easily fed into an extruder or injection molding machine and the impact resistance of the composition can also be markedly improved.

The glass fiber may have a cross section selected from the group consisting of circular, elliptical, rectangular, and dumbbell-like shapes. The dumbbell-like shape refers to a shape in which two circles are connected by a line. The glass fiber may be a planar specialty glass fiber. In this case, the glass fiber is chopped so as to have an area of 25 to 30 μm (w) and 5 to 10 μm (l) and a length of 2 to 7 mm. The use of the chopped glass fiber is preferred in terms of processability, surface characteristics, and mechanical properties (particularly, flexural strength) of the thermoplastic resin composition.

The glass fiber may be treated with a treatment agent to prevent an undesired reaction with the thermoplastic resin and to achieve improved degree of impregnation. The glass fiber may be treated during production or subsequent processing.

The treatment agent may be, for example, a lubricant, a coupling agent or a surfactant. The lubricant is used to form good strands having a constant diameter and thickness during production of the glass fiber. The coupling agent serves to impart good adhesion between the glass fiber and the resin. The treatment agent is suitably selected to impart excellent physical properties to the glass fiber as the reinforcing material according to the kinds of the resin and the glass fiber used.

The reinforcing material may be included in an amount ranging from 0.1 to 50 parts by weight, based on 100 parts by weight of the thermoplastic resin. Within this range, the mechanical strengths of the resin composition and a molded material can be improved. In addition, the resin composition is highly flowable, ensuring high processability and moldability.

The thermoplastic resin composition may further include a carbonaceous conductive additive. The carbonaceous conductive additive may be selected from, for example, carbon black, graphene, carbon nanofibers, fullerenes, and carbon nanowires. The carbonaceous conductive additive may be added in an amount ranging from about 0.1 to about 30 parts by weight, based on 100 parts by weight of the thermoplastic resin. Within this range, the conductivity of the resin composition can be further improved without a deterioration in the physical properties of the resin composition.

The carbonaceous conductive additive may be carbon black. As the carbon black, there may be used, for example, furnace black, channel black, acetylene black, lamp black, thermal black or ketjen black. However, the kind of the carbon black is not limited. The carbon black may have an average particle diameter in the range of 20 to 100 μm. Within this range, the conductivity of the resin composition can be efficiently improved.

The carbonaceous conductive additive may be graphene. Graphene, a two-dimensional carbon allotrope, can be produced by various methods, such as exfoliation, chemical oxidation/reduction, thermolysis, and chemical vapor deposition. The exfoliation refers to a method in which a single layer of graphene is physically separated from graphite, the chemical oxidation/reduction refers to a method in which graphite is dispersed in a solution and is chemically reduced to obtain graphene, and the thermolysis refers to a method in which a silicon carbide (SiC) substrate is thermally decomposed at a high temperature to obtain a graphene layer. Particularly, an exemplary method for synthesizing high-quality graphene is chemical vapor deposition.

According to one embodiment, the graphene may have an aspect ratio of 0.1 or less, consist of 100 layers or less, and have a specific surface area of 300 $m^2/g$ or more. The graphene refers to a single planar network of $sp^2$-bonded carbon (C) atoms in the hcp crystal structure of graphite. In a broad sense, graphene is intended to include graphene composite layers consisting of a plurality of layers.

According to one embodiment, the carbonaceous conductive additive may be a carbon nanofiber with large specific surface area, high electrical conductivity, and good adsorbability. For example, the carbon nanofiber may be produced by decomposing a carbon-containing gaseous compound at a high temperature, growing the decomposition products, and further growing the resulting carbon materials in the form of a fiber on a previously prepared metal catalyst. The decomposed carbon products are subjected to adsorption, decomposition, absorption, diffusion, and deposition on the surface of the metal catalyst having a size of several nanometers to form a laminate of graphene layers with high crystallinity and purity. The metal catalyst may be a transition metal such as nickel, iron or cobalt and may be in the form of particles. The carbon nanofiber formed on the catalyst particles grow to a diameter in the nanometer range, which corresponds to about one-hundredth of the diameters (~10 μm) of other kinds of general purpose carbon fibers. The small diameter allows the carbon nanofiber to have large specific surface area, high electrical conductivity, good adsorbability, and excellent mechanical properties. Due to these advantages, the carbon nanofiber is suitable for use in the resin composition.

The carbon nanofiber can be synthesized by various methods, including arc discharge, laser ablation, plasma chemical vapor deposition, and chemical vapor deposition (CVD). The growth of the carbon nanofiber is influenced by such factors as temperature and the kinds of carbon source, catalyst, and substrate used. Particularly, diffusion of the substrate and the catalyst particles and a difference in interfacial interaction therebetween affect the shape and microstructure of the synthesized carbon nanofiber.

The term "bulk density" used herein means the apparent density of the carbon nanotubes as raw materials and can be calculated by dividing the weight of the carbon nanotubes by their volume.

According to one embodiment, the thermoplastic resin composite may further include one or more additives selected from the group consisting of flame retardants, impact modifiers, flame retardant aids, lubricants, plasticizers, heat stabilizers, anti-drip agents, antioxidants, compatibilizers, light stabilizers, pigments, dyes, and inorganic additives. The additives may be used in an amount of 0.1 to 10 parts by weight, based on 100 parts by weight of the thermoplastic resin. Specific kinds of these additives are well known in the art and may be appropriately selected by those skilled in the art.

According to one embodiment, the thermoplastic resin used in the production of the composite may be any of those known in the art. According to one embodiment, the thermoplastic resin may be selected from the group consisting of: polycarbonate resins; polypropylene resins; polyamide resins; aramid resins; aromatic polyester resins; polyolefin resins; polyester carbonate resins; polyphenylene ether resins; polyphenylene sulfide resins; polysulfone resins; polyethersulfone resins; polyarylene resins; cycloolefin resins; polyetherimide resins; polyacetal resins; polyvinyl acetal resins; polyketone resins; polyether ketone resins; polyether ether ketone resins; polyaryl ketone resins; polyether nitrile resins; liquid crystal resins; polybenzimidazole resins; polyparabanic acid resins; vinyl polymer and copolymer resins obtained by polymerization or copolymerization of one or more vinyl monomers selected from the group consisting of aromatic alkenyl compounds, methacrylic esters, acrylic esters, and vinyl cyanide compounds; diene-aromatic alkenyl compound copolymer resins; vinyl cyanide-diene-aromatic alkenyl compound copolymer resins; aromatic alkenyl compound-diene-vinyl cyanide-N-phenylmaleimide copolymer resins; vinyl cyanide-(ethylene-diene-propylene (EPDM))-aromatic alkenyl compound copolymer resins; polyolefins; vinyl chloride resins; chlorinated vinyl chloride resins; and mixtures thereof. Specific kinds of these resins are well known in the art and may be appropriately selected by those skilled in the art.

Examples of the polyolefin resins include, but are not limited to, polypropylene, polyethylene, polybutylene, and poly(4-methyl-1-pentene). These polyolefin resins may be used alone or in combination thereof. In one embodiment, the polyolefins are selected from the group consisting of polypropylene homopolymers (e.g., atactic polypropylene, isotactic polypropylene, and syndiotactic polypropylene), polypropylene copolymers (e.g., polypropylene random copolymers), and mixtures thereof. Suitable polypropylene copolymers include, but are not limited to, random copolymers prepared by polymerization of propylene in the presence of at least one comonomer selected from the group consisting of ethylene, but-1-ene (i.e. 1-butene), and hex-1-ene (i.e. 1-hexene). In the polypropylene random copolymers, the comonomer may be present in any suitable amount but is typically present in an amount of about 10% by weight or less (for example, about 1 to about 7% by weight or about 1 to about 4.5% by weight). The polyester resins may be homopolyesters or copolyesters as polycondensates of dicarboxylic acid component and diol component skeletons. Representative examples of the homopolyesters include polyethylene terephthalate, polypropylene terephthalate, polybutylene terephthalate, polyethylene-2,6-naphthalate, poly-1,4-cyclohexanedimethylene terephthalate, and polyethylene diphenylate. Particularly preferred is polyethylene terephthalate that can be used in many applications due to its low price. The copolyesters are defined as polycondensates of at least three components selected from the group consisting of components having a dicarboxylic acid skeleton and components having a diol skeleton. Examples of the components having a dicarboxylic acid skeleton include terephthalic acid, isophthalic acid, phthalic acid, 1,4-naphthalene dicarboxylic acid, 1,5-naphthalene dicarboxylic acid, 2,6-naphthalene dicarboxylic acid, 4,4'-diphenyldicarboxylic acid, 4,4'-diphenylsulfone dicarboxylic acid, adipic acid, sebacic acid, dimer acid, cyclohexane dicarboxylic acid, and ester derivatives thereof. Examples of the components having a glycol skeleton include ethylene glycol, 1,2-propanediol, 1,3-butanediol, 1,4-butanediol, 1,5-pentanediol, diethylene glycol, polyalkylene glycol, 2,2-bis(4'-6-hydroxyethoxyphenyl)propane, isosorbates, 1,4-cyclohexanedimethanol, and spiroglycols.

Examples of the polyamide resins include nylon resins and nylon copolymer resins. These polyamide resins may be used alone or as a mixture thereof. The nylon resins may be: polyamide-6 (nylon 6) obtained by ring-opening polymerization of commonly known lactams such as ε-caprolactam and ω-dodecalactam; nylon polymerization products obtainable from amino acids such as aminocaproic acid, 11-aminoundecanoic acid, and 12-aminododecanoic acid; nylon polymers obtainable by polymerization of an aliphatic, alicyclic or aromatic diamine, such as ethylenediamine, tetramethylenediamine, hexamethylenediamine, undecamethylenediamine, dodecamethylenediamine, 2,2,4-trimethylhexamethylenediamine, 2,4,4-trimethylhexamethylenediamine, 5-methylnonahexamethylenediamine, meta-xylenediamine, para-xylenediamine, 1,3-bisaminomethylcyclohexane, 1,4-bisaminomethylcyclohexane, 1-amino-3-aminomethyl-3,5,5-trimethylcyclohexane, bis(4-aminocyclohexane)methane, bis(4-methyl-4-aminocyclohexyl)methane, 2,2-bis(4-aminocyclohexyl)propane, bis(aminopropyl)piperazine or aminoethylpiperidine, with an aliphatic, alicyclic or aromatic dicarboxylic acid, such as adipic acid, sebacic acid, azelaic acid, terephthalic acid, 2-chloroterephthalic acid or 2-methylterephthalic acid; and copolymers and mixtures thereof. Examples of the nylon copolymers include: copolymers of polycaprolactam (nylon 6) and polyhexamethylene sebacamide (nylon 6,10); copolymers of polycaprolactam (nylon 6) and polyhexamethylene adipamide (nylon 66); and copolymers of polycaprolactam (nylon 6) and polylauryllactam (nylon 12).

The polycarbonate resins may be prepared by reacting a diphenol with phosgene, a haloformate, a carbonate or a combination thereof. Specific examples of such diphenols include hydroquinone, resorcinol, 4,4'-dihydroxydiphenyl, 2,2-bis(4-hydroxyphenyl)propane (also called tisphenol-A'), 2,4-bis(4-hydroxyphenyl)-2-methylbutane, bis(4-hydroxyphenyl)methane, 1,1-bis(4-hydroxyphenyl)cyclohexane, 2,2-bis(3-chloro-4-hydroxyphenyl)propane, 2,2-bis(3,5-dimethyl-4-hydroxyphenyl)propane, 2,2-bis(3,5-dichloro-4-hydroxyphenyl)propane, 2,2-bis(3,5-dibromo-4-hydroxyphenyl)propane, bis(4-hydroxyphenyl)sulfoxide, bis(4-hydroxyphenyl)ketone, and bis(4-hydroxyphenyl)ether. Of these, 2,2-bis(4-hydroxyphenyl)propane, 2,2-bis(3,5-dichloro-4-hydroxyphenyl)propane or 1,1-bis(4-hydroxyphenyl)cyclohexane is preferred, and 2,2-bis(4-hydroxyphenyl)propane is more preferred.

The polycarbonate resins may be mixtures of copolymers prepared from two or more different diphenols. As the polycarbonate resins, there may be used, for example, linear polycarbonate resins, branched polycarbonate resins, and polyester carbonate copolymer resins.

The linear polycarbonate resins may be, for example, bisphenol-A type polycarbonate resins. The branched polycarbonate resins may be, for example, those prepared by reacting a polyfunctional aromatic compound, such as trimellitic anhydride or trimellitic acid, with a diphenol and a carbonate. The polyfunctional aromatic compound may be included in an amount of 0.05 to 2 mole %, based on the total moles of the corresponding branched polycarbonate resin. The polyester carbonate copolymer resins may be, for example, those prepared by reacting a difunctional carboxylic acid with a diphenol and a carbonate. As the carbonate, there may be used, for example, a diaryl carbonate, such as diphenyl carbonate, or ethylene carbonate.

As the cycloolefin polymers, there may be exemplified norbornene polymers, monocyclic olefin polymers, cyclic conjugated diene polymers, vinyl alicyclic hydrocarbon polymers, and hydrides thereof. Specific examples of the cycloolefin polymers include ethylene-cycloolefin copolymers available under the trade name "Apel" (Mitsui Chemicals), norbornene polymers available under the trade name "Aton" (JSR), and norbornene polymers available under the trade name "Zeonoa" (Nippon Zeon).

Another aspect of the present invention provides a method for producing the thermoplastic resin composite. The method is not particularly limited. For example, the thermoplastic resin composite may be produced by feeding a mixture of the raw materials into a generally known melt-mixer such as a single-screw extruder, a twin-screw extruder, a Banbury mixer, a kneader or a mixing roll, and kneading the mixture at a temperature of approximately 100 to 500° C. or 200 to 400° C.

The mixing order of the raw materials is not particularly limited. For example, the thermoplastic resin, the carbon nanotubes having an average length in the range defined above, and optionally the additives are pre-blended, and the blend is homogeneously melt kneaded using a single- or twin-screw extruder at or above the melting point of the thermoplastic resin. Alternatively, the raw materials are mixed in a solution and the solvent is removed. Taking into consideration productivity, it is preferred to homogeneously melt knead the raw materials using a single- or twin-screw extruder. It is particularly preferred to use a twin-screw extruder when the raw materials are homogeneously melt kneaded at or above the melting point of the thermoplastic resin.

Any kneading method may be used to produce the composite of the present invention. For example, the thermoplastic resin and the carbon nanotubes may be kneaded together at one time. According to a master pellet method, a resin composition (master pellets) including the carbon nanotubes at a high concentration in the thermoplastic resin is prepared, the carbon nanotubes are further added to the resin composition until the concentration reaches a specified level, followed by melt kneading. According to another preferred method, the composite is produced by feeding the thermoplastic resin and optionally the additives into an extruder, and supplying the carbon nanotubes to the extruder through a side feeder. This method is effective in suppressing damage to the carbon nanotubes.

As a result of the extrusion, the composite can be produced in the form of pellets.

According to one embodiment, the average length of the carbon nanotubes as raw materials used in the production of the composite may be measured by scanning electron microscopy (SEM) or transmission electron microscopy (TEM). Specifically, a powder of the carbon nanotubes as raw materials is imaged by SEM or TEM and the image is then analyzed using an image analyzer, for example, Scandium 5.1 (Olympus soft Imaging Solutions GmbH, Germany) to determine the average length of the carbon nanotubes.

The average length and distribution state of the carbon nanotubes included in the composite can be determined by dispersing the resin solid in an organic solvent, for example, acetone, ethanol, n-hexane, chloroform, p-xylene, 1-butanol, petroleum ether, 1,2,4-trichlorobenzene or dodecane, to obtain a dispersion having a predetermined concentration, taking an image of the dispersion by SEM or TEM, and analyzing the image using an image analyzer.

The carbon nanotubes-thermoplastic resin composite produced by the method is free from problems associated with production processing and secondary processability without losing its mechanical strength. In addition, the composite has sufficient electrical properties despite the presence of a small amount of the carbon nanotubes.

According to one embodiment, the composite may be molded into various articles by any suitable process known in the art, such as injection molding, blow molding, press molding or spinning. The molded articles may be injection molded articles, extrusion molded articles, blow molded articles, films, sheets, and fibers.

The films may be manufactured by known melt film-forming processes. For example, according to a single- or twin-screw stretching process, the raw materials are melted in a single- or twin-screw extruder, extruded from a film die, and cooled down on a cooling drum to manufacture an unstretched film. The unstretched film may be appropriately stretched in the longitudinal and transverse directions using a roller type longitudinal stretching machine and a transverse stretching machine called a tenter.

The fibers include various fibers such as undrawn yarns, drawn yarns, and ultra-drawn yarns. The fibers may be manufactured by known melt spinning processes. For example, chips made of the resin composition as a raw material are supplied to and kneaded in a single- or twin-screw extruder, extruded from a spinneret through a polymer flow line switcher and a filtration layer located at the tip of the extruder, cooled down, stretched, and thermoset.

The composite of the present invention may have a tensile strength of 83 MPa or more, 95 MPa or more or 100 MPa or more, a tensile modulus of 3.3 GPa or more, 4 GPa or more or 5 GPa or more, and a surface resistivity of $1.0 \times 10^9$ Ω/sq. or less.

Particularly, the composite of the present invention may be processed into molded articles such as antistatic articles, electrical/electronic product housings, and electrical/electronic parts, taking advantage of its high conductivity and excellent mechanical properties.

According to one embodiment, the molded articles may be used in various applications, including automotive parts, electrical/electronic parts, and construction components. Specific applications of the molded articles include: automobile underhood parts, such as air flow meters, air pumps, automatic thermostat housings, engine mounts, ignition bobbins, ignition cases, clutch bobbins, sensor housings, idle speed control valves, vacuum switching valves, ECU housings, vacuum pump cases, inhibitor switches, revolution sensors, acceleration sensors, distributor caps, coil bases, ABS actuator cases, radiator tank tops and bottoms, cooling fans, fan shrouds, engine covers, cylinder head covers, oil caps, oil pans, oil filters, fuel caps, fuel strainers, distributor caps, vapor canister housings, air cleaner housings, timing belt covers, brake booster parts, various cases, various tubes, various tanks, various hoses, various clips, various valves, and various pipes; automobile interior parts, such as torque control levers, safety belt parts, register blades, washer levers, window regulator handles, window regulator handle knobs, passing light levers, sun visor brackets, and various motor housings, automobile exterior parts, such as roof rails, fenders, garnishes, bumpers, door mirror stays, spoilers, hood louvers, wheel covers, wheel caps, grill apron cover frames, lamp reflectors, lamp bezels, and door handles; various automobile connectors, such as wire harness connectors, SMJ connectors, PCB connectors, and door grommet connectors; and electric/electronic parts, such as relay cases, coil bobbins, optical pickup chassis, motor cases, notebook PC housings and internal parts, LED display housings and internal parts, printer housings and internal parts, housings and internal parts of portable terminals such as cell phones, mobile PCs, and portable mobiles, recording medium (e.g., CD, DVD, PD, and FDD) drive housings and internal parts, copier housings and internal parts, facsimile housings and internal parts, and parabolic antennas.

Further applications include household and office electric appliance parts, for example, VTR parts, television parts, irons, hair dryers, rice boiler parts, microwave oven parts, acoustic parts, parts of imaging devices such as video cameras and projectors, substrates of optical recording media such as Laserdiscs (registered trademark), compact discs (CD), CD-ROM, CD-R, CD-RW, DVD-ROM, DVD-R, DVD-RW, DVD-RAM and Blu-ray discs, illuminator parts, refrigerator parts, air conditioner parts, typewriter parts, and word processor parts.

Other applications include: housings and internal parts of electronic musical instruments, household game machines, and portable game machines; electric/electronic parts, such as various gears, various cases, sensors, LEP lamps, connectors, sockets, resistors, relay cases, switches, coil bobbins, capacitors, variable capacitor cases, optical pickups, oscillators, various terminal boards, transformers, plugs, printed circuit boards, tuners, speakers, microphones, headphones, small motors, magnetic head bases, power modules, semiconductor parts, liquid crystal parts, FDD carriages, FDD chassis, motor brush holders, transformer members, and coil bobbins; and various automobile connectors, such as wire harness connectors, SMJ connectors, PCB connectors, and door grommet connectors.

The molded article can be used as an electromagnetic shielding material because it has improved conductivity sufficient to absorb electromagnetic waves. The electromagnetic shielding material exhibits improved electromagnetic wave absorptivity because it has the ability to absorb and decay electromagnetic waves.

The thermoplastic resin composite and the molded article composed of the composite can be recycled, for example, by grinding the composite and the molded article, preferably into a powder, and optionally blending with additives to obtain a resin composition. The resin composition can be processed into the composite of the present invention and can also be molded into the molded article of the present invention.

MODE FOR THE INVENTION

The present invention will be explained in detail with reference to the following examples. The invention may, however, be embodied in many different forms and should not be construed as being limited to these examples. The examples are provided to fully convey the invention to a person having ordinary knowledge in the art.

EXAMPLES

Components used in the following examples and comparative examples are as follows.
(a) Polyamide resin
LUMID GP-1000B (LG Chem Ltd.).
(b) Carbon nanotubes
Carbon nanotubes having different $I_d/I_g$ ratios, average lengths, average diameters, and numbers of graphene sheets, which are shown in Table 1.

Examples 1-6 and Comparative Examples 1-5

The carbon nanotubes and a glass fiber in the amounts shown in Table 1 were mixed with the polyamide resin in such an amount that the total amount was 100 wt %. The mixture was then extruded in a twin-screw extruder (L/D=42, ϕ=40 mm) while raising the temperature profile to 280° C., to produce pellets having dimensions of 0.2 mm×0.3 mm×0.4 mm.

The pellets were molded in an injection molding machine under the flat profile conditions at a temperature of 280° C. to produce 3.2 mm thick, 12.7 mm long dog-bone shaped specimens. Each specimen was allowed to stand at 23° C. and a relative humidity of 50% for 48 hr.

The bundle average length and average diameter of the multi-walled carbon nanotubes as raw materials were measured by imaging a powder of the multi-walled carbon nanotubes using SEM and analyzing the images using Scandium 5.1 (Olympus soft Imaging Solutions GmbH, Germany).

The mechanical properties of the specimens were measured by the following methods. The results are shown in Table 1.

Tensile Strength and Tensile Modulus

Each of the specimens (3.2 mm thick) obtained in Examples 1-6 and Comparative Examples 1-5 was evaluated for tensile strength and tensile modulus in accordance with the ASTM D638 testing standard.

Surface Resistivity (Ω/Cm)

The surface resistance of each of the specimens obtained in Examples 1-6 and Comparative Examples 1-5 was measured using SRM-100 (PINION) in accordance with ASTM D257.

Average Length of Residual Carbon Nanotubes

The pellets were dispersed in chloroform to obtain 0.1 g/l dispersions. Images of the dispersions were taken by TEM (Libra 120, Carl Zeiss Gmbh, Germany) and analyzed using SCANDIUM 5.1 (Olympus Soft Imaging Solutions GmbH) to determine the average lengths of the residual carbon nanotubes.

As shown in Table 1, the residual lengths of the carbon nanotubes in the composites of Examples 1-6 were large. In addition, the composites of Examples 1-6 showed improved electrical conductivities while possessing high tensile strengths and high tensile moduli. In contrast, the composites of Comparative Examples 1-5 showed low tensile strengths and low tensile moduli as a whole compared to the composites of Examples 1-6. Particularly, the rates of residual length of the carbon nanotubes in the composites of Examples 1-6 were less than 40%, leading to high surface resistivities (i.e. low conductivities) of the composites.

Example 7

Specimens were produced in the same manner as in Example 1, except that the carbon nanotubes, a glass fiber, and carbon black in the amounts shown in Table 2 were mixed with the polyamide resin in such an amount that the total amount was 100 wt %. The physical properties of the specimens were measured in the same methods as described in Example 1. The results are shown in Table 2.

TABLE 2

|  |  | Example 7 |
|---|---|---|
| Glass fiber content (wt %) |  | 10 |
| Carbon black content (wt %) |  | 3 |
| CNTs | Content (wt %) | 1.5 |
|  | Pristine length (nm) | 1650 |
|  | $I_d/I_g$ | 0.6 |
|  | Average diameter (nm) | 19 |
|  | Number of layers of CNT walls | 20 |
|  | Average length of residual CNTs (nm) | 1238 |
|  | Rate of residual length (%) | 75 |
| Physical properties of composite | Tensile strength (MPa) | 130 |
|  | Tensile modulus (GPa) | 6.5 |
|  | Surface resistivity (Ω/sq.) | $1 \times 10^6$ |

As shown in Table 2, the addition of carbon black as a conductive additive contributed to further improvements in the tensile modulus and conductivity of the composite of Example 7.

TABLE 1

|  |  | Example No. | | | | | | Comparative Example No. | | | | |
|---|---|---|---|---|---|---|---|---|---|---|---|---|
|  |  | 1 | 2 | 3 | 4 | 5 | 6 | 1 | 2 | 3 | 4 | 5 |
| Glass fiber content (wt %) |  | 10 | 10 | 10 | 10 | 10 | 10 | 10 | 10 | 10 | 10 | 10 |
| CNTs | Content (wt %) | 1.5 | 1.5 | 1.5 | 1.5 | 1.5 | 1.5 | 0 | 1.5 | 1.5 | 1.5 | 1.5 |
|  | Pristine length (nm) | 1500 | 1500 | 1400 | 1600 | 1800 | 1700 | — | 1500 | 1500 | 1400 | 1600 |
|  | $I_d/I_g$ | 0.8 | 0.6 | 0.8 | 0.8 | 0.8 | 0.6 | — | 1.2 | 0.8 | 0.8 | 0.8 |
|  | Average diameter (nm) | 10 | 10 | 20 | 10 | 20 | 20 | — | 10 | 5 | 10 | 5 |
|  | Number of layers of CNT walls | 10 | 10 | 10 | 20 | 20 | 20 | — | 10 | 10 | 5 | 5 |
|  | Average length of residual CNTs (nm) | 750 | 900 | 850 | 950 | 1250 | 1241 | — | 540 | 510 | 500 | 330 |
|  | Rate of residual length (%) | 50 | 60 | 61 | 59 | 69 | 73 | — | 36 | 34 | 36 | 21 |
| Physical properties of composites | Tensile strength (MPa) | 108 | 113 | 108 | 116 | 131 | 130 | 104 | 106 | 102 | 102 | 101 |
|  | Tensile modulus (GPa) | 5.0 | 5.5 | 5.3 | 5.8 | 6.4 | 6.4 | 4.6 | 4.8 | 4.8 | 4.8 | 4.8 |
|  | Surface resistivity (Ω/sq.) | $1 \times 10^7$ | $1 \times 10^6$ | $1 \times 10^8$ | $1 \times 10^7$ | $1 \times 10^8$ | $1 \times 10^8$ | $>1 \times 10^{14}$ | $1 \times 10^{11}$ | $1 \times 10^{10}$ | $1 \times 10^{11}$ | $1 \times 10^{11}$ |

The invention claimed is:

1. A composite obtained by processing a resin composition comprising a thermoplastic resin, multi-walled carbon nanotubes, wherein the average diameter of the multi-walled carbon nanotubes is 10 nm-30 nm, the walls of the multi-walled carbon nanotubes consist of 10 or more layers of graphene, the $I_d/I_g$ of the multi-walled carbon nanotubes is 0.6 or more, wherein the rate of residual length of the carbon nanotubes present in the composite is 40% to 99%, the rate of residual length being defined by Equation 1:

Rate of residual length (%)=(Content of ≥500 nm long carbon nanotubes in the composite)/(Content of all carbon nanotubes in the composite)×100.

2. The composite according to claim 1, further comprising a reinforcing material.

3. The composite according to claim 2, wherein the reinforcing material has a fibrous shape.

4. The composite according to claim 2, wherein the reinforcing material is selected from carbon fibers, glass fibers, milled glass fibers, aramid fibers, alumina fibers, silicon carbide fibers, ceramic fibers, asbestos fibers, gypsum fibers, metal fibers, and mixtures thereof.

5. The composite according to claim 2, wherein the reinforcing material is present in an amount of 0.1 to 50 parts by weight, based on 100 parts by weight of the thermoplastic resin.

6. The composite according to claim 1, wherein the walls of the multi-walled carbon nanotubes consist of 10 to 50 graphene layers.

7. The composite according to claim 1, wherein the composite has a tensile strength of 83 MPa or more.

8. The composite according to claim 1, wherein the composite has a tensile modulus of 3.3 GPa or more.

9. The composite according to claim 1, wherein the composite has a surface resistivity of $1.0 \times 10^9$ Ω/sq. or less.

10. The composite according to claim 1, wherein the multi-walled carbon nanotubes are of a bundle type or non-bundle type.

11. The composite according to claim 1, wherein the multi-walled carbon nanotubes are present in an amount of 0.1 to 10 parts by weight, based on 100 parts by weight of the thermoplastic resin.

12. The composite according to claim 1, wherein the multi-walled carbon nanotubes present in the composite has an average length of 0.5 μm to 50 μm.

13. The composite according to claim 1, further comprising a carbonaceous conductive additive.

14. The composite according to claim 13, wherein the carbonaceous conductive additive is selected from carbon black, graphene, fullerenes, and carbon nanofibers.

15. The composite according to claim 13, wherein the carbonaceous conductive additive is present in an amount of 0.1 to 30 parts by weight, based on 100 parts by weight of the thermoplastic resin.

16. The composite according to claim 1, wherein the processing is extrusion.

17. A molded article comprising the composite according to claim 1.

18. The molded article according to claim 17, wherein the processing is extrusion, injection molding or a combination thereof.

19. The molded article according to claim 17, wherein the molded article is an antistatic article, an electrical/electronic product housing or an electrical/electronic part.

* * * * *